May 20, 1952 R. B. DOME 2,597,575

FREQUENCY MODULATION REFLEX LIMITING CIRCUIT

Filed March 1, 1949

Inventor:
Robert B. Dome,
by Merton D. Morse
His Attorney.

Patented May 20, 1952

2,597,575

UNITED STATES PATENT OFFICE 2,597,575

FREQUENCY MODULATION REFLEX LIMITING CIRCUIT

Robert B. Dome, Geddes, N. Y., assignor to General Electric Company, a corporation of New York Application March 1, 1949, Serial No. 78,906

5 Claims. (Cl. 250—20)

This invention relates generally to frequency modulation receivers and more particularly to limiting and demodulating circuits utilized in conjunction therewith.

The frequency modulation system for the communication of intelligence has certain inherent advantages in the reduction of interfering noise. However, if these advantages are to be fully realized, the final output voltage of the demodulation circuit in a frequency-modulation receiver must be proportional to the frequency deviation of the carrier wave and not to its variations in amplitude.

An ordinary frequency discriminator provides an output whose amplitude is proportional to the frequency deviation of a carrier wave and also to its amplitude. Accordingly, it is necessary to remove any amplitude variations from the carrier wave before it reaches the discriminator. To accomplish this, intermediate frequency amplifying stages having very high gains may be incorporated into a frequency modulation receiver, and a limiting circuit provided for restricting the amplitude of the output voltage to a certain fixed value. Thus in a typical receiver of this type, all signals having an amplitude falling within certain limits are amplified and subsequently limited to a uniform level. After the limiting stage, the signal is detected or demodulated through a frequency discriminator circuit to reproduce the signal, free of any noise due to extraneous amplitude modulation. However, this system requires extreme care in design in order to avoid troubles due to overall regeneration, and is also quite elaborate and expensive since it requires a large number of amplifying stages.

Another system presently utilized to achieve the same object, avoids the necessity for excessive amplification and subsequent limiting of the signal through the use of a demodulator commonly known as a ratio detector. This type of detector provides an output which is fundamentally independent of the amplitude of the frequency modulation wave supplied to it and which is essentially proportional only to the frequency deviation of the wave from its center frequency. This circuit avoids the necessity for a large number of amplifying and limiting stages, but it has certain disadvantages because its conversion efficiency is low and it cannot handle large degrees of amplitude modulation without distortion in its output, thereby failing in this respect to accomplish the primary purpose of a frequency modulation receiver.

An object of my invention is to provide a new and improved frequency modulation receiver circuit which suppresses amplitude modulation over a wide range of values.

A further object of my invention is to provide a circuit which requires only a fraction of the input signal level required in similar circuits previously known in the art for providing a useful frequency modulation output, free of any amplitude modulation.

For further objects and advantages and for a better understanding of the invention, attention is now directed to the following description and accompanying drawings, and also to the appended claims in which the features of the invention believed to be novel are more particularly pointed out.

In accordance with my invention, I employ a reflex system of amplification, along with certain limiting circuits, for providing an output voltage which is greatly amplified over the input and substantially free of any amplitude modulation. To this end, I use a first electron discharge device to amplify the signal, and I provide a second device which operates as a frequency doubler, and returns the signal, doubled in frequency, to the input of the first device, which thereafter amplifies it again at the harmonic frequency and supplies it to a balanced frequency modulation detector. In addition, limiting circuits are incorporated into this reflex amplifying system to maintain the amplitude of the output voltage at a fixed level.

Figure 1:
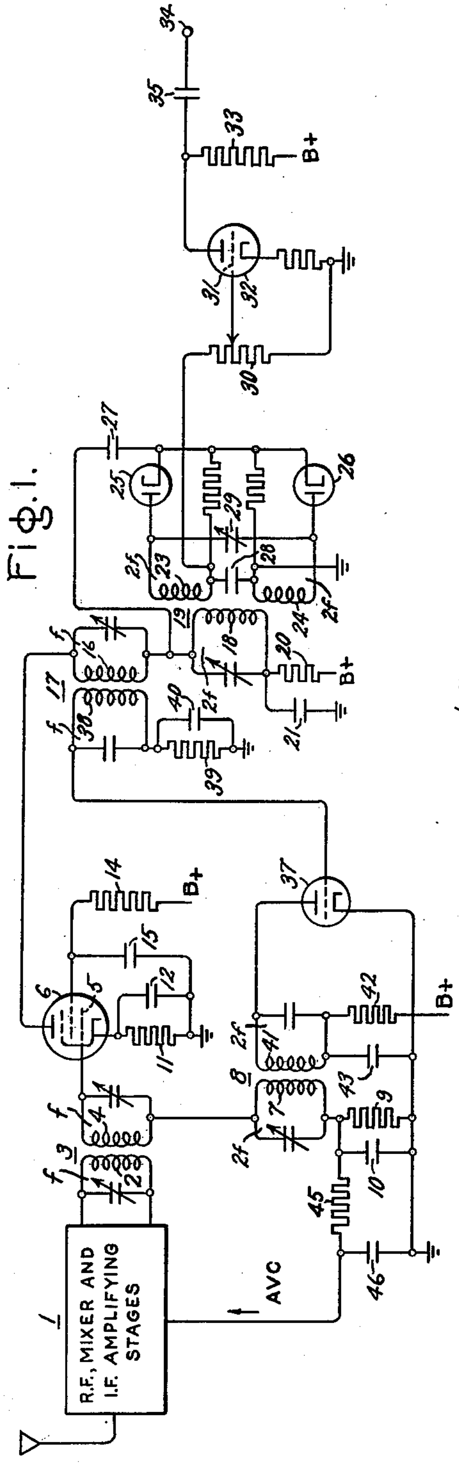
Fig. 1 is a schematic diagram of a frequency modulation receiver embodying my invention.

Thus, referring to Fig. 1, there is shown a source of frequency modulation waves 1, which may be a radio receiver comprising an antenna and various radio frequency and intermediate frequency amplifying stages along with a mixer and local oscillator. Source 1 supplies its output in the form of a wave, frequency modulated in response to a signal and subject to amplitude modulation resulting from undesirable noise, to a primary winding 2 of a transformer 3. The transformer 3 is tuned to pass a band of frequencies on either side of the center frequency of this frequency modulated wave. The secondary 4 of transformer 3 has one terminal connected to the control electrode 5 of an electron discharge device 6 of the pentode type. The other terminal of secondary 4 is connected to the upper terminal of the secondary 7 of a transformer 8, of which the lower terminal is connected to ground through a resistor 9 in parallel with a shunt capacitor 10.

The cathode of device 6 is connected to ground through a biasing resistor 11 which is by-passed to ground by a capacitor 12. The screen electrode of device 6 is connected, through a series resistor 14, to a source of positive potential indicated by B+, and is by-passed to ground by a capacitor 15. The anode of device 6 is connected through the primary winding 16 of a transformer 17, thence through the primary winding 18 of a discriminator transformer 19, and thence through a resistor 20, to the source of positive potential B+. Resistor 20 is by-passed to ground by a shunt capacitor 21.

The secondary windings 23 and 24 of transformer 19 are connected to the anodes of a pair of diodes 25 and 26, which function as rectifying devices. The cathodes of these diodes are connected together and also are connected to the high side of winding 18 through a coupling capacitor 27. The other terminals of the windings 23 and 24 are connected together through a capacitor 28, which is of a magnitude sufficient to act as a shunt for the frequency modulated carrier wave, but which is sufficiently small so as not to have any appreciable effect at the frequencies of the signal superimposed as a modulation on the carrier. A capacitor 29 serves as a tuning element for the windings 23 and 24. The transformer 19 and diodes 25 and 26, along with the associated coupling elements, constitute a well known frequency discriminating type of detector commonly found in commercial frequency modulation receivers.

The output of the discriminator circuit is supplied to a potentiometer 30, from where it is coupled to the grid 31 of an electron discharge device 32 of the triode type, operating as an audio amplifier. Operating potential is supplied to the anode of device 32 from a source of positive potential B+, through a resistor 33. The amplified output signal is coupled from the anode of device 32 to an output terminal 34, by means of a capacitor 35. This terminal may be connected to a power amplifier and thence to a loud speaker for translation of the signal into audible energy.

An electron discharge device 37, shown here as a triode, has its control electrode or grid connected to the high side of secondary winding 38 of transformer 17. The low side of secondary winding 38 is connected to ground through a parallel combination of a resistor 39 and a capacitor 40. The anode of device 37 is connected through a primary winding 41 of transformer 8 and through a resistor 42 to the source of operating potential B+. The low end of the primary winding 41 of transformer 8 is by-passed to ground through a capacitor 43. Automatic volume control voltage may be obtained from the unidirectional voltage developed across resistor 9, and is filtered by a resistor 45 and a capacitor 46 before being supplied to suitable control circuits in the intermediate frequency amplifying stages in the source 1.

In operation, the frequency modulated carrier wave is supplied from source 1, through the tuned transformer 3, to the device 6, wherein amplification takes place. Both the input transformer 3 and the output transformer 17 operating in conjunction with device 6, are tuned to the fundamental frequency $f$ of the carrier wave. For example, where the intermediate frequency amplifying stages in the source 1 operate at a center frequency of 10.7 megacycles, these transformers are tuned to a center frequency of 10.7 megacycles. The first function of device 6 is thus to receive the carrier wave at its fundamental frequency $f$, to amplify it, and to supply it to the output transformer 17.

Device 37 operates as a frequency doubler. Its control electrode receives the amplified fundamental frequency wave from the secondary 38 of transformer 17, and its anode is coupled to the primary 41 of transformer 8. Both the primary winding 41 and secondary winding 7 of transformer 8 are tuned to the second harmonic $2f$ of the fundamental frequency of the carrier wave. Where the fundamental frequency of the wave supplied from source 1 is 10.7 megacycles, both windings of transformer 8 are tuned to a center frequency of 21.4 megacycles. The secondary winding of transformer 8 is coupled to the control electrode 5 of device 6 through the series connection with the secondary winding 4 of transformer 3, and accordingly, device 6 receives the second harmonic $2f$ at its control electrode. The second function of device 6 is thus to amplify the second harmonic of the fundamental, and to supply it to the primary winding 18 of the discriminator transformer 19, which is tuned to the second harmonic $2f$ of the carrier wave.

The circuit comprising transformer 19 and diodes 25 and 26, along with the associated coupling elements, constitutes a balanced frequency discriminator. It provides an output voltage, across one of the diodes, which varies equally and oppositely with respect to an output voltage across the other diode in response to the instantaneous frequency of the carrier wave supplied to the primary winding 18. These voltages are rectified in opposition by the respective diodes and, accordingly, a voltage proportional to their difference is developed across capacitor 28. In accordance with principles well known in the art, the voltage developed across capacitor 28 is then proportional to the instantaneous deviation of the carrier wave from its center frequency. This signal is applied through potentiometer 30 to the control electrode 31 of device 32 and thereafter appears at output terminal 34.

Limiting takes place at three different points in the circuit. The first point is at the input to device 37 and results from the developing of a negative bias voltage across resistor 39 and capacitor 40. As a result, the alternating component of the anode current in device 37 is restricted between the limits imposed by the conditions of zero voltage and cut-off voltage at the control electrode. The second limiting action takes place in the input circuit to device 6 through the operation of resistor 9 and capacitor 10 which develop a negative bias at the control electrode 5. This limits the anode current of device 6 in a similar manner to that of device 37, and again restricts it between the limits of zero and cut-off voltage of the control electrode. The third limiting action takes place as a result of the use of a very high resistance for resistor 42 in series between the primary of transformer 8 and the source of operating potential B+. The anode voltage for device 37 is thereby limited to a fairly low value, thus restricting the maximum amplitude of the output voltage supplied to transformer 8.

Figure 2:
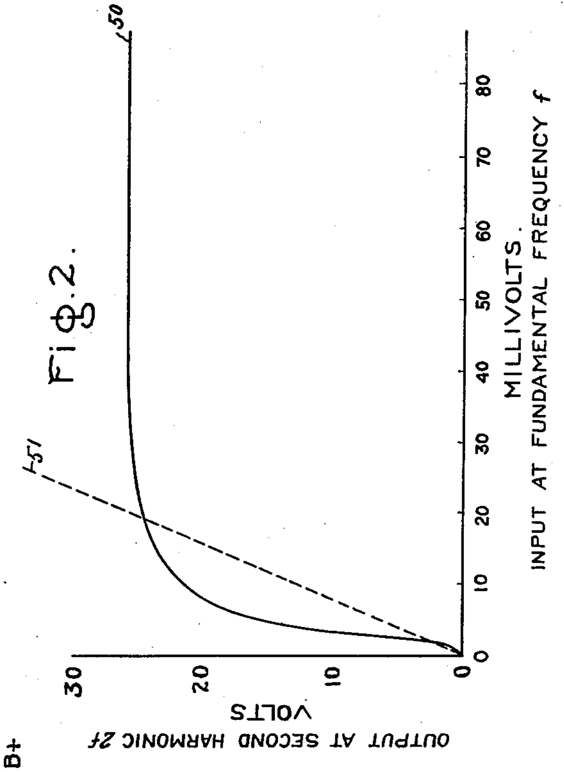
Fig. 2 shows a curve illustrating certain specific characteristics of an actual construction of a frequency modulation receiver embodying my invention.

In a particular construction of a reflex limiting circuit embodying my invention, the following constants for the circuit elements have been found to insure efficient operation:

Resistor 9—240,000 ohms
Resistor 45—1,000,000 ohms
Resistor 42—240,000 ohms
Resistor 39—100,000 ohms
Device 6—tube type 6SH7
Device 37—½ section of tube type 6SN7GT
Device 32—triode section of tube type 6AQ7GT
Devices 25 and 26—diode sections of tube type 6AQ7GT The results of an operating test with this particular construction are illustrated by curves of Fig. 2. Curve 50 illustrates the relation between the voltage at the fundamental frequency of the carrier wave supplied to the control electrode 5 of device 6, and the output voltage at the second harmonic developed across the primary of transformer 19. The fundamental frequency in this particular construction was taken at 4.4 megacycles rather than at 10.7 megacycles, for purposes of convenience only. Obviously, the same result could be obtained at a frequency of 10.7 megacycles. The curve is in the nature of a well known saturation curve, and it will be noted that limiting is obtainable for any value of input on or over the knee of the curve. The knee of the curve occurs at an input voltage of approximately 10 millivolts and accordingly, for any input voltage greater than this value, limiting takes place. When the input voltage attains 20 millivolts, the curve has become so flattened that its slope is less than one fourteenth that of a straight line through the origin and attaining the same amplitude of output for the same value of input. In other words, the slope of curve 50 is but one fourteenth that of a linear amplifier which would have the same gain for the same value of input, as represented by line 51 in Fig. 2.

This difference in slopes is significant. For instance, a 15% amplitude modulation of the input at the fundamental frequency causes only 1% amplitude modulation in the second harmonic supplied to the discriminator transformers. The suppression in amplitude modulation, with an input voltage of 40 millivolts, is such that the residual modulation amplitude at the discriminator is reduced by a factor of approximately 100 below the amplitude modulation existing at the input wave, and becomes entirely negligible. As the amplitude of the input increases still further, the principal result is that greater and greater degrees of input signal amplitude modulation can be accommodated, so that, at 100 millivolts input, as much as 75% amplitude modulation can be almost completely suppressed.

The time constants of the resistance-capacitance combinations at the limiting points in the circuit are sufficiently short to permit a faithful following of the wave envelope. The time constants under consideration here are those of the circuits comprising resistor 11 and capacitor 12, resistor 39 and capacitor 40, and resistor 42 and capacitor 43. Also the magnitude of resistor 45 is made several times larger than that of resistor 9 for the purpose of preventing low frequency feed-back to the circuit through the intermediate frequency amplifying stages. The automatic volume control voltage produced by this circuit is of the "delayed" type, that is, it is of the type which becomes effective only after a certain minimum amplitude of input signal has been attained. This delay is caused by the fact that the input voltage to the control electrode of device 6 must be greater than the bias voltage developed by the cathode resistor 11 before any grid current flows to produce the automatic volume control voltage.

My circuit also has the advantage of providing quieter operation than the circuits used heretofore when no signal at all is being received. This is illustrated by the flattening occurring in curve 50 below 4 millivolts input. As a result, only a negligible output occurs for any input below this level. The reason for this flattening in curve 50 is that the frequency doubling action of device 37 depends on nonlinearity in its operation, and for very small input voltages, its operation is more or less linear and hence no appreciable output occurs at the second harmonic.

While a specific embodiment has been shown and described, it will, of course, be understood that various modifications may be made without departing from the invention. To mention but one very obvious modification, the transformers which have been described as of the double coil type may be replaced by triple coil transformers. This assists in the avoidance of instability at the fundamental frequency because the same bandwidth may be obtained with considerably more attenuation outside the band, as at the fundamental frequency for example. The appended claims are, therefore, intended to cover any such modifications within the true spirit and scope of the invention.

What I claim as new and desire to secure by Letters Patent of the United States is:

1. An amplifying and limiting circuit for a frequency modulation system, comprising a first electronic discharge device having an input circuit and an output circuit, said input circuit being adapted to receive a carrier wave frequency modulated about a fundamental center frequency in response to a signal and subject to undesirable amplitude modulation, a first network connected to said output circuit, said first network being tuned to said fundamental frequency, a second electronic discharge device having an input circuit connected to said first network and an output circuit tuned to a harmonic of said fundamental and connected to the input circuit of said first device, and a second network connected to the output circuit of said first device, said second network comprising a balanced frequency discriminator tuned to said harmonic.

2. An amplifying and limiting circuit for a frequency modulation system, comprising a first electronic discharge device having an input circuit and an output circuit, said input circuit being adapted to receive a carrier wave frequency modulated about a fundamental center frequency in response to a signal and subject to undesirable amplitude modulation, a resistance connected in series with said input circuit to limit the effect of said wave, a first network connected to said output circuit, said first network being tuned to said fundamental frequency, a second electronic discharge device having an input circuit connected to said first network in series with a limiting resistance and an output circuit tuned to a harmonic of said fundamental and connected to the input circuit of said first device, and a second network connected to the output circuit of said first device, said second network comprising a balanced frequency discriminator tuned to said harmonic for demodulating said harmonic carrier wave and detecting said signal.

3. A reflex amplifying and limiting circuit for a frequency modulation system, comprising a first electronic discharge device having an anode, a cathode, and a control electrode, an input circuit connected to said control electrode, said input circuit being adapted to receive a carrier wave frequency modulated in response to a desired signal and amplitude modulated in response to undesirable signals, and being tuned to the fundamental center frequency of said wave, a source of operating potential, a first and a second network serially connected between said anode and said source, said first network being tuned to said fundamental frequency, a second electronic discharge device having an anode, a cathode, and a control electrode, a connection from said first network to the control electrode of said second device, said connection comprising a limiting resistance, an output circuit serially connected between the anode of said second device and said source, said output circuit being tuned to a harmonic of said fundamental and connected, in series with a limiting resistance, to the input circuit to said first device, and a balanced frequency discriminating circuit coupled to said second network and tuned to said harmonic for demodulating said harmonic carrier wave and detecting said desired signal.

4. A reflex amplifying and limiting circuit for a frequency modulation system comprising a first electronic discharge device having an anode, a cathode, and a control electrode, an input circuit connected to said control electrode, said input circuit being adapted to receive a carrier wave, frequency modulated in response to a desired signal and amplitude modulated in response to undesirable interfering signals and noise, and being tuned to the fundamental center frequency of said wave, a source of operating potential, a first and a second transformer, each of said transformers having a primary winding serially connected between said anode and said source, a second electron discharge device having an anode, a cathode and a control electrode, said first transformer having a secondary winding connected, in series with a parallel combination of a resistance and a capacitance, between the control electrode and the cathode of said second device, said first transformer being tuned to said fundamental frequency, a third transformer having a primary winding serially connected between the anode of said second device and said source and a secondary winding connected, in series with a parallel combination of a resistance and a capacitance, to said input circuit, both windings of said third transformer being tuned to a harmonic of said wave, the second of said transformers having a pair of secondary windings tuned to said harmonic and connected into a balanced frequency discriminating circuit for demodulating said harmonic and detecting said desired signal.

5. A reflex amplifying and limiting circuit for a frequency modulation receiver, comprising a first electronic discharge device having an anode, a cathode, and a control electrode, an input transformer having a primary winding adapted to be energized by a carrier wave frequency modulated in response to a desired signal and amplitude modulated in response to undesirable signals, and a secondary winding tuned to the fundamental center frequency of said wave, said secondary winding having a pair of terminals of which one is connected to said control electrode, a source of operating potential, a first and a second transformer, each of said transformers having a primary winding serially connected between said anode and said source, a second electron discharge device having an anode, a cathode and a control electrode, said first transformer having a secondary winding connected, in series with a parallel combination of a resistance and a capacitance, between the control electrode and the cathode of said second device, said first transformer being tuned to said fundamental frequency, a third transformer having a primary winding serially connected between the anode of said second device and said source and a secondary winding connected, in series with a parallel combination of a resistance and a capacitance, to said other terminal of said input transformer, both windings of said third transformer being tuned to a harmonic of said wave, the second of said transformers having a pair of secondary windings tuned to said harmonic and connected into a balanced frequency discriminating circuit for demodulating said harmonic and detecting said desired signal.

ROBERT B. DOME.

REFERENCES CITED

The following references are of record in the file of this patent:

UNITED STATES PATENTS

| Number | Name | Date |
|---|---|---|
| 1,657,451 | Affel | Jan. 31, 1928 |
| 1,660,930 | MacDonald | Feb. 28, 1928 |
| 2,344,678 | Crosby | Mar. 21, 1944 |
| 2,379,721 | Koch | July 3, 1945 |
| 2,425,923 | Crosby | Aug. 19, 1947 |
| 2,456,915 | Carlson | Dec. 21, 1948 |
| 2,501,122 | Corrington | Mar. 21, 1950 |